United States Patent
Choi

(10) Patent No.: US 7,692,945 B2
(45) Date of Patent: Apr. 6, 2010

(54) RECONFIGURABLE INPUT/OUTPUT IN HIERARCHICAL MEMORY LINK

(75) Inventor: Joo-Sun Choi, Yongin-si (KR)

(73) Assignee: Samsung Electronics, Co., Ltd. (KR)

( * ) Notice: Subject to any disclaimer, the term of this patent is extended or adjusted under 35 U.S.C. 154(b) by 412 days.

(21) Appl. No.: 11/484,173

(22) Filed: Jul. 11, 2006

(65) Prior Publication Data

US 2007/0064515 A1 Mar. 22, 2007

(30) Foreign Application Priority Data

Sep. 21, 2005 (KR) .................. 10-2005-0087751

(51) Int. Cl.
*G11C 5/06* (2006.01)

(52) U.S. Cl. ...................................... 365/63

(58) Field of Classification Search ............ 365/230.05, 365/63; 257/673, 668, 737, 666, 738, 777, 257/E23.01
See application file for complete search history.

(56) References Cited

U.S. PATENT DOCUMENTS

| | | | |
|---|---|---|---|
| 5,331,681 A * | 7/1994 | Doi et al. ................ | 377/116 |
| 6,421,250 B1 * | 7/2002 | Kim et al. ............... | 361/784 |
| 7,392,331 B2 * | 6/2008 | James et al. ............. | 710/36 |
| 2001/0026009 A1 * | 10/2001 | Tsunesa et al. .......... | 257/673 |
| 2002/0023191 A1 | 2/2002 | Fudeyasu ................ | 711/104 |
| 2003/0227079 A1 * | 12/2003 | Chia et al. .............. | 257/723 |
| 2005/0268061 A1 * | 12/2005 | Vogt ...................... | 711/167 |

FOREIGN PATENT DOCUMENTS

| | | |
|---|---|---|
| JP | 2002-007308 | 1/2002 |
| JP | 2003-122624 | 4/2003 |

* cited by examiner

*Primary Examiner*—J. H. Hur
*Assistant Examiner*—Douglas King
(74) *Attorney, Agent, or Firm*—Mills & Onello, LLP

(57) ABSTRACT

A memory system and memory module includes a plurality of memory devices, each having a plurality, e.g. four, ports for transmitting and receiving command signals, write data signals and read data signals. One of the memory devices is connected to a host or controller, and the remaining memories are connected together, typically by point-to-point links. When the memory system configuration is such that at least one of the ports in at least one of the memory devices is not used, one or more other ports can use the pins that may otherwise have been used by the unused ports. As a result, a set of reconfigurable, shared pins is defined in which two ports share the pins. The port that is not being used in a particular application for the memory device is not connected to the shared pins, and another port that is being used in the application is connected to the shared pins. This allows for the used of fewer package pins and, consequently, reduced package size.

16 Claims, 18 Drawing Sheets

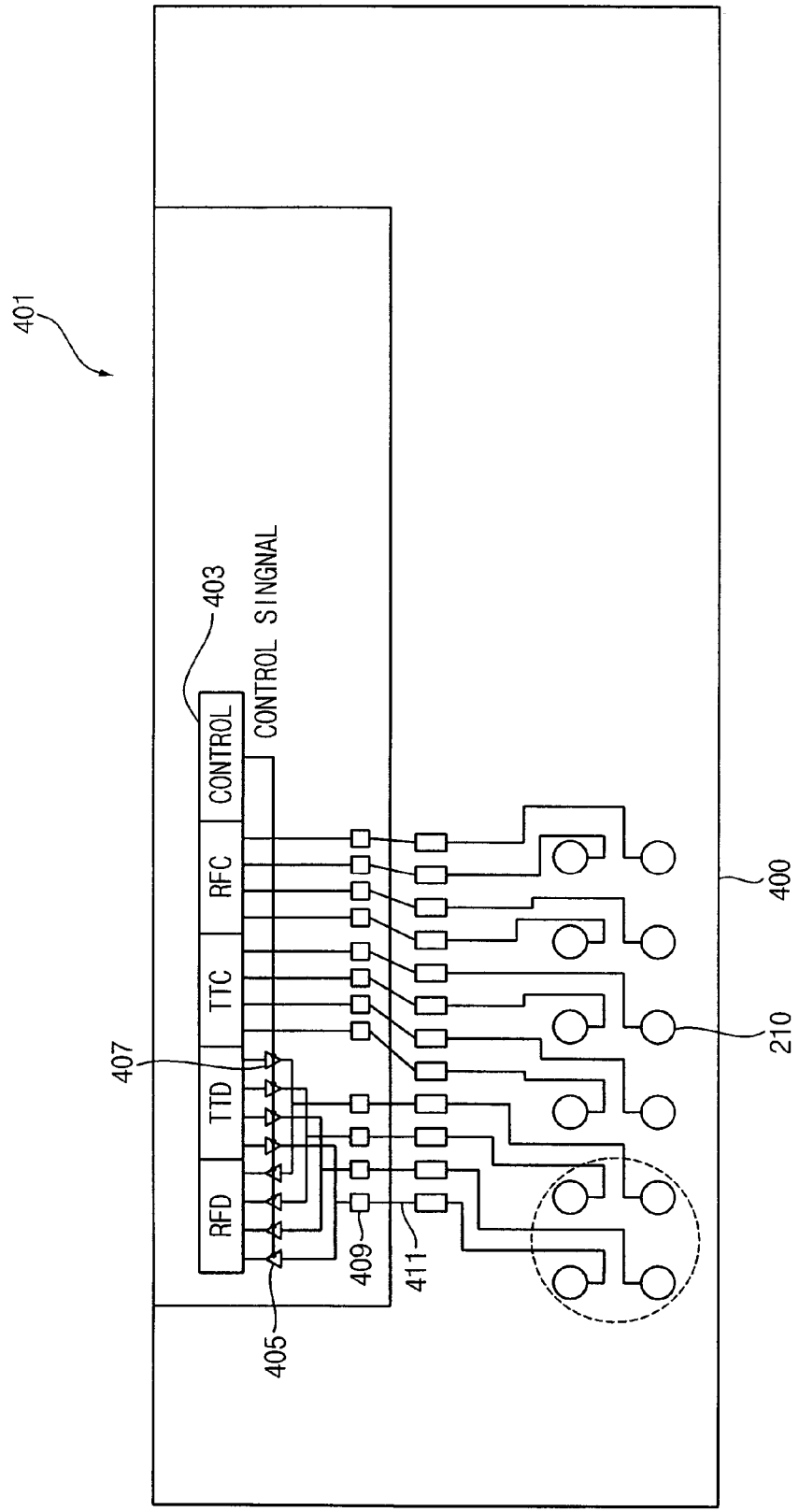

RECONFIGURABLE INPUT/OUTPUT IN HIERARCHICAL MEMORY LINK

RELATED APPLICATION

This application relies for priority on Korean Patent Application number P2005-0087751, filed on Sep. 21, 2005, in the Korean Intellectual Property Office, the contents of which are incorporated herein in their entirety by reference.

FIELD OF THE INVENTION

The invention relates to a memory package and a memory module, and more particularly, to a memory package having a reconfigurable pin and a memory module using the same.

BACKGROUND OF THE INVENTION

FIG. 1 contains a block diagram of a conventional memory system 10 having a plurality of memory devices M0-Mn, e.g., n=7, on a plurality of memory modules 12, 14, connected to a controller 16. Data signal lines DQ0-7, DQ8-15, . . . , DQ56-63 have multi-drop links, such that the memory devices share the data signal lines. The capacitive load of the data lines affects the operation speed of the memory system. For example, 8 SDRAM, 4DDR (double data rate), 2DDR2 operational configurations typically may be connected together to respective data signal lines. As the operating speed of such systems increases, it becomes important to reduce capacitive loading and stub of the data signal lines to avoid the degradation of operation speed introduced by the capacitive loading. Multiple module connector slots also require that connector pins be shared along the data signal lines. This creates discontinuity in the signal path, which also degrades performance.

The command/address (C/A) signal lines C/A0 and C/A1 also have multi-drop links, so that memory devices M0-Mn on the same module 12, 14 share the same C/A signal line. In general, 8 or 16 memory devices share a single C/A line, depending on the system bus speed. For higher bus speeds, 8 memory devices typically share a common C/A line.

At present, the speed of a C/A line is slower than that of a data DQ line because of the loading effects. For DDR operation, the C/A bus is being operated at single data rate (SDR), half of the DQ speed. For higher speed operation, it will also be important to reduce capacitive loading and stub of the C/A line.

For a high-speed memory system, i.e., a system operating at more than 2 Gbps, a point-to-point (PTP) link, as opposed to a multi-drop link, should be used to reduce capacitive loading and stub of each signal line to meet high-speed operational requirements. For a high-density memory system supporting the PTP link, a plurality of memory modules are needed to support the memory application such as server or networking, but each memory module comprising the PTP link should have an input/output I/O module tab for each signal line. This causes an increase in the number of tabs, making it difficult to design and produce a suitable memory module. An approach in a high-density memory system supporting PTP without increasing the number of module tabs is to use stacked memory or a more dense planar location of DRAM in a single memory module.

Furthermore, memory devices mounted on one memory module should have PTP links between them for high-speed operation. In this case, each memory device has an I/O pin for each signal. The C/A and data information should be conveyed to the next level of DRAM tied through the stacking or planar configuration. Further, if differential signaling for high-speed signaling is adapted to the PTP link, the number of I/O pins is doubled. As the number of I/O pins increases, the package size also increases, and signal routing between memories gets more complex. Also, to reduce the capacitive loading of the DRAM, a uni-directional bus is necessary to achieve a given speed requirement.

FIGS. 2A and 2B are schematic block diagrams of a conventional memory system 10 illustrating a PTP repeating link structure. The system 10 includes a host or controller 16 connected to a first memory device M1, which is connected to a second memory device M2. Each of the memory devices includes a receive from controller port RFC, a transmit to memory port TTD, a receive from memory port RFD and a transmit to controller port TTC. Each RFC port is linked to the host 16 or the TTD port of another memory device through N pins. Each TTD port is linked to an RFC port of another memory device through N pins. Each TTC port is linked with the host 16 or the RFD port of another memory device through M pins. Each RFD port is linked with the TTC port of another memory through M pins. It is noted that N may be the same as M, or they may be different. All signals in the system 10 are linked using PTP links. M1 is connected to the host 16 by way of a PTP link. Also, M2 is connected to M1 or the host 16 by way of a PTP link. M1 and M2 may be constructed using a planar structure or a stacked structure.

The memory system 10 includes a merged WR/CA signal line which includes the merging of write signals and the C/A signals, and a read data line (RD). It is noted that the WR data line may be separated from the C/A line and also may be merged with the read data line RD instead of the C/A line.

FIGS. 2A and 2B illustrate read operations for both memory devices M1 and M2. The solid line represents a read operation performed on M1, and the dashed line represents a read operation on M2. As shown in FIG. 2A, a read operation on M1 results in the C/A signal for the read operation being transmitted directly to the memory M1 and the read data from M1 being transmitted directly to the host 16. A read operation on M2 involves the C/A signal for the read operation being transmitted to M1 and then repeated by M1 to M2. The read data from M2 is transmitted to M1 and repeated by M1 to the host 16. In FIG. 2B, read operation on M2 involves the C/A signal for the read operation being transmitted to M1 and repeated to M2. The read data from M2 is transmitted from the M2 TTC port directly to the host 16. A read operation on M1 involves the C/A signal for the read operation being transmitted to M1. The read data from M1 is transmitted by M1 to M2 and is transmitted directly from the M2 TTC port to the host 16.

The difference between the procedures of FIGS. 2A and 2B is in the path of the read operation. In FIG. 2A, the read latency of M1 is shorter that that of M2, but, in FIG. 2B, the read latency of M1 and M2 is the same.

FIGS. 3A and 3B are schematic block diagrams of another conventional memory system 20 illustrating a PTP link structure. In this configuration, M1 and M2 are operated at the same time. As a result, each of the memories M1 and M2 outputs half of the read data, i.e., M/2, to the host 16. This configuration is useful when it is desirable to reduce the number of pins required to connect between DRAMs and between the DRAM and the host 16.

FIG. 4 contains a table that illustrates the number of pins required in a memory package for each of the memory system configurations of FIGS. 2A, 2B, 3A and 3B. Specifically, "A", "B", "C" and "D" refer to the memory systems of FIGS. 2A, 2B, 3A and 3B, respectively. In the table, "pin" refers to a ball in a ball grid array (BGA) package or a lead in a plastic package. The number of pins shown in the table includes only signal pins and excludes power pins and miscellaneous pins. Normally, a memory chip is manufactured to have the maximum number of pads to meet the connection requirements of all PTP links. This prevents the need to provide separate chips for different types of links. Also, the package should have the maximum superset number of pins to satisfy each link. Package size is typically determined by the number of pins on the package. That is, in general, the greater the number of pins, the larger the package size. A "type", i.e., type A, B, C or D, defines the maximum number of pins for that type. Accordingly, referring to the table of FIG. 4, the maximum number of pins for a memory chip is 2(N+M).

SUMMARY OF THE INVENTION

According to the invention, a memory is provided in which package pins are selectively reconfigurable as being for either a receiving port or a transmitting port according to a PTP link architecture. The present invention provides a memory package capable of supporting PTP links without an increase in package size to support multiple superset numbers of link types. The invention also provides a memory system having PTP links among memory devices using the same package.

According to a first aspect, the invention is directed to a memory system having a primary memory and a secondary memory coupled to the primary memory. A set of external conductor elements connects to at least one of the primary memory and the secondary memory. Each of the primary memory and the secondary memory comprises a receiving port and a transmitting port, the transmitting port having a first predetermined number of contacts for transferring signals and the receiving port having a second predetermined number of contacts for transferring signals. A set of conductors is configured to selectively connect only one of the receiving port contacts and the transmitting port contacts to a subset of the external conductor elements such that only one of the transmitting port and the receiving port is connected to the subset of the external conductor elements, the one of the transmitting port and receiving port connected to the external conductor elements being used and the other of the transmitting port and receiving port being unused, the subset of external conductor elements being of a quantity the same as at least one of the first and second predetermined number.

In one embodiment, the external conductor elements are balls of a ball grid array device package. In one embodiment, the external conductor elements are pins. The memory device can be a DRAM memory device.

According to another aspect, the invention is directed to a memory device having a receiving port for receiving signals and a transmitting port for transmitting signals, the transmitting port having a first predetermined number of contacts for transferring signals and the receiving port having a second predetermined number of contacts for transferring signals. A set of external conductor elements connects to the memory device. A set of conductors is configured to selectively connect only one of the receiving port and transmitting port contacts to a subset of the external conductor elements such that only one of the transmitting port and the receiving port is connected to the subset of the external conductor elements, the one of the transmitting port and receiving port connected to the external conductor elements being used and the other of the transmitting port and receiving port being unused, the subset of external conductor elements being of a quantity the same as at least one of the first and second predetermined number.

In one embodiment, the external conductor elements are balls of a ball grid array device package. In one embodiment, the external conductor elements are pins. The memory device can be a DRAM memory device.

According to another aspect, the invention is directed to a package for a memory device. The package includes a set of external conductor elements for connecting to a memory circuit within the package, the memory circuit including a transmitting port and a receiving port, the transmitting port and the receiving port having a first predetermined number of conductors for providing connections to the transmitting port and the receiving port to connect command/address and data signals of the transmitting and receiving ports to the exterior of the package, the set of external conductor elements comprising a second predetermined number of external conductor elements for providing connections between the transmitting and receiving ports and the exterior of the package for the command/address and data signals, the second predetermined number being less than the first predetermined number.

In one embodiment, the set of external conductor elements comprises a subset of external conductor elements allocated to the transmitting port and the receiving port, such that, when one of the transmitting and receiving port is not being used, the other of the transmitting and receiving port is connected to the subset of external conductor elements.

In one embodiment, the external conductor elements are balls of a ball grid array device package. In one embodiment, the external conductor elements are pins. The memory device can be a DRAM memory device.

According to another aspect, the invention is directed to a memory system having a primary memory and a secondary memory coupled to the primary memory. A set of external conductor elements connects to the at least one of the primary memory and the secondary memory. Each of the primary memory and the secondary memory comprises a receiving port and a transmitting port. A set of conductors is configured to selectively connect only one of the receiving port and transmitting port of at least one of the primary and secondary memory to the set of external conductor elements.

In one embodiment, the external conductor elements are balls of a ball grid array device package. In one embodiment, the external conductor elements are pins. The memory device can be a DRAM memory device.

In one embodiment, each of the primary memory and the secondary memory has a first predetermined number of input/output connections for accommodating the transmitting and receiving ports, and the set of external conductor elements has a second predetermined number of external conductor elements, the second predetermined number being less than the first predetermined number.

According to another aspect, the invention is directed to a memory device having a receiving port for receiving signals and a transmitting port for transmitting signals. A set of external conductor elements connects to the memory device. A set of conductors is configured to selectively connect only one of the receiving port and transmitting port to the set of external conductor elements.

In one embodiment, the external conductor elements are balls of a ball grid array device package. In one embodiment, the external conductor elements are pins. The memory device can be a DRAM memory device.

In one embodiment, the receiving port and the transmitting port are associated with a first predetermined number of input/output connections for accommodating the transmitting and receiving ports, and the set of external conductor elements has a second predetermined number of external conductor elements, the second predetermined number being less than the first predetermined number.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

FIG. 13 is a schematic plan view of a memory device having a ball grid array package in accordance with an embodiment of the invention.

DETAILED DESCRIPTION OF PREFERRED EMBODIMENTS OF THE INVENTION

Figure 1:
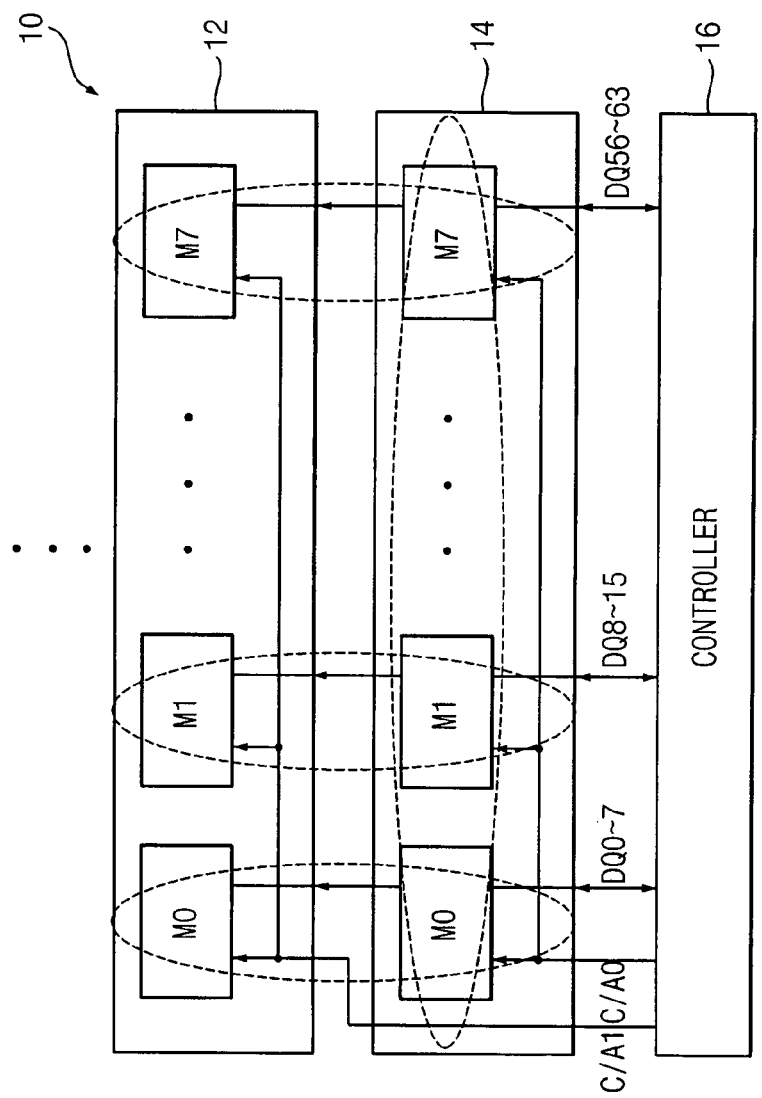
FIG. 1 contains a block diagram of a conventional memory system having a plurality of memory devices.
Figure 2A:
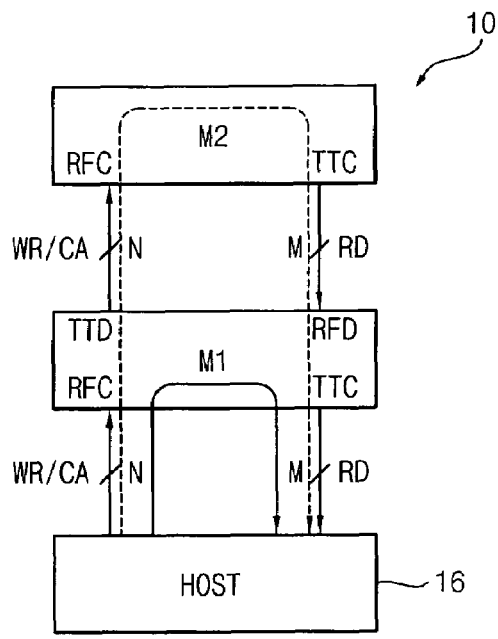
FIGS. 2A and 2B are schematic block diagrams of a conventional memory system having a PTP repeating link structure.
Figure 2B:
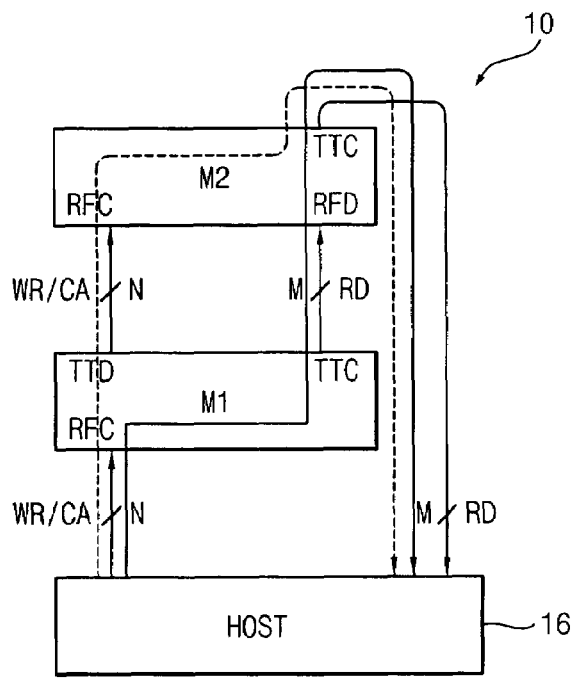
Figure 3A:
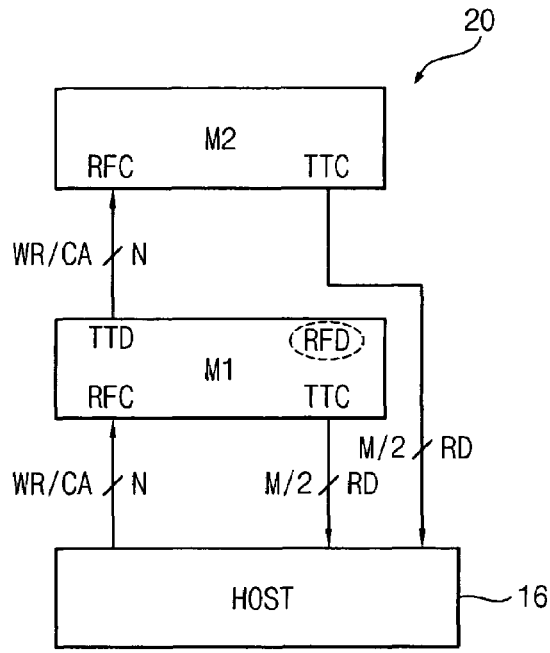
FIGS. 3A and 3B are schematic block diagrams of another conventional memory system having a PTP link structure.
Figure 3B:
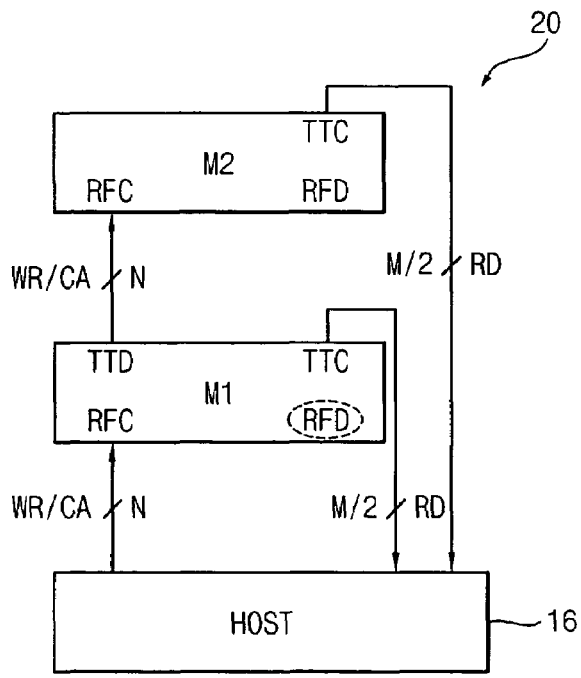
Figure 4:
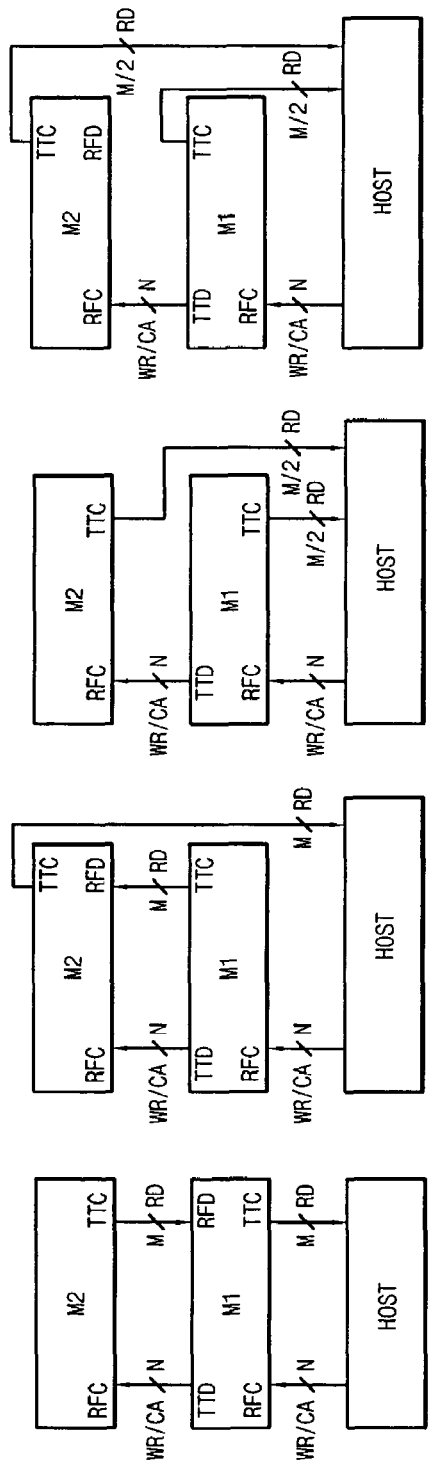
FIG. 4 contains a table that illustrates the number of pins required in a memory package for each of the configurations of FIGS. 2A, 2B, 3A and 3B.
Figure 5A:
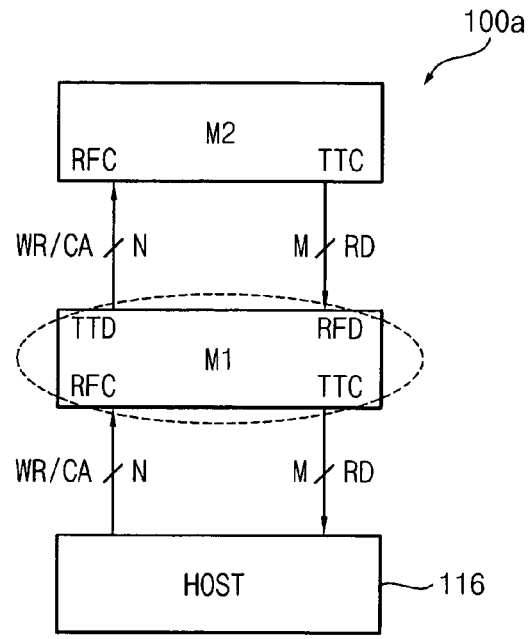
FIGS. 5A and 5B contain schematic block diagrams of a memory system in which package pins are shared among ports, in accordance with embodiments of the invention.
Figure 5B:
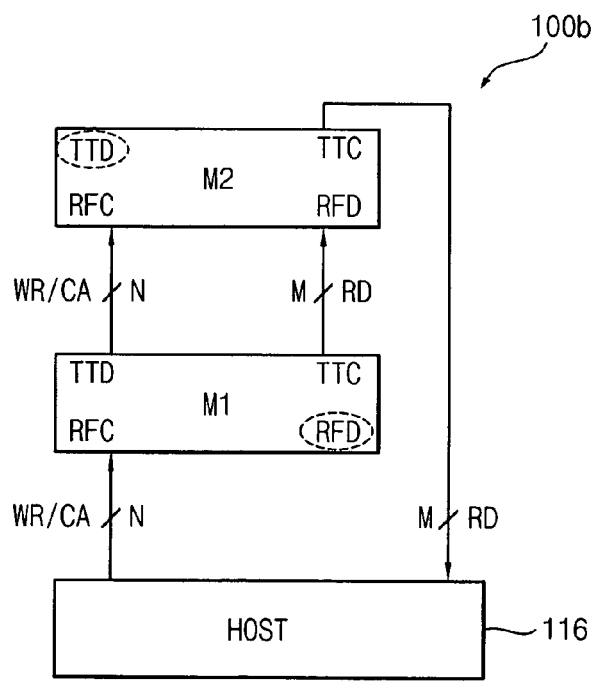

FIGS. 5A and 5B contain schematic block diagrams of a memory system 100a, 100b in which package pins are shared among ports, in accordance with embodiments of the invention. In the system 100a of FIG. 5A, the package for M1 cannot share pins because M1 has no unused port. That is, all of the RFC, TTD, RFD and TTC ports of M1 are used. However, in the system 100b of FIG. 5B, the RFD port of M1 and the TTD port of M2 are not used. Therefore, the RFD port and TTD port can share package pins. Thus, in accordance with the invention, if there is an unused port in each memory comprising a PTP link structure, the sharing of package pins is possible. Therefore, the number of package pins (ball or lead) is reduced by the sharing of package pins according to the invention.

Figure 6A:
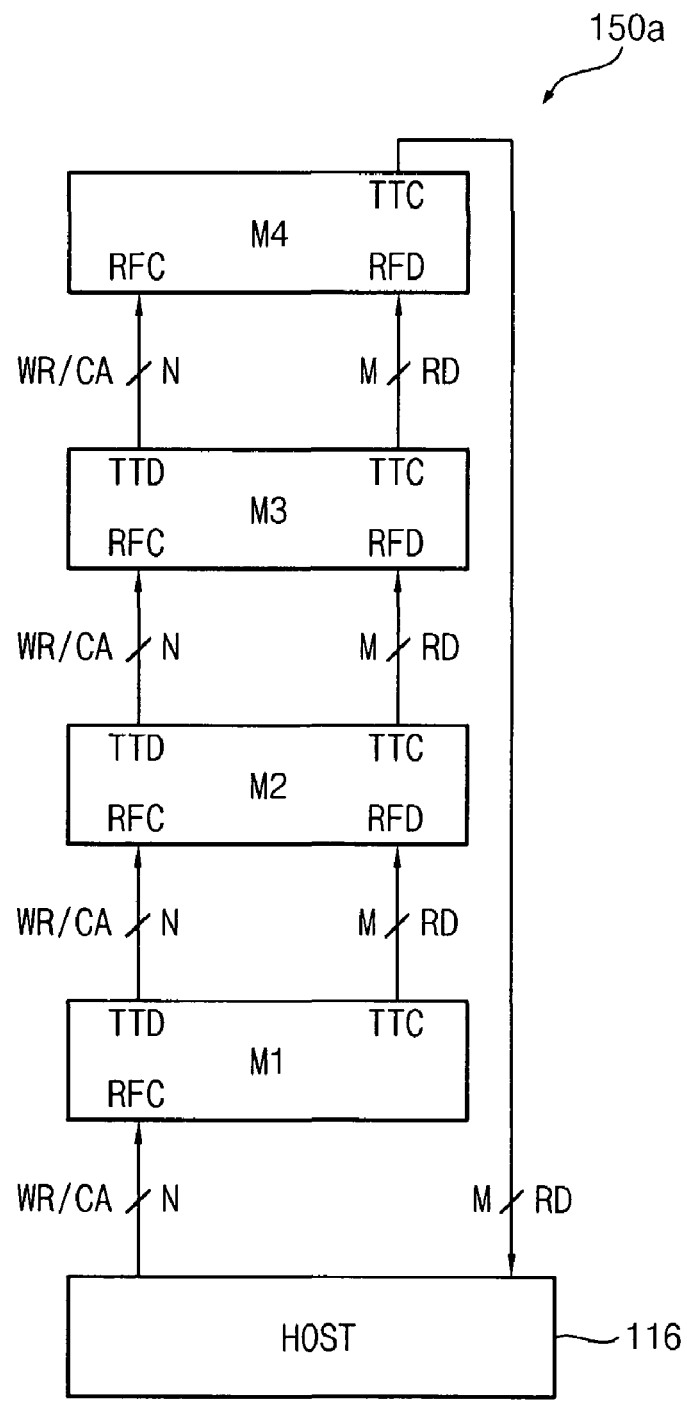
FIGS. 6A and 6B contain schematic block diagrams of a memory system in accordance with embodiments of the invention.
Figure 6B:
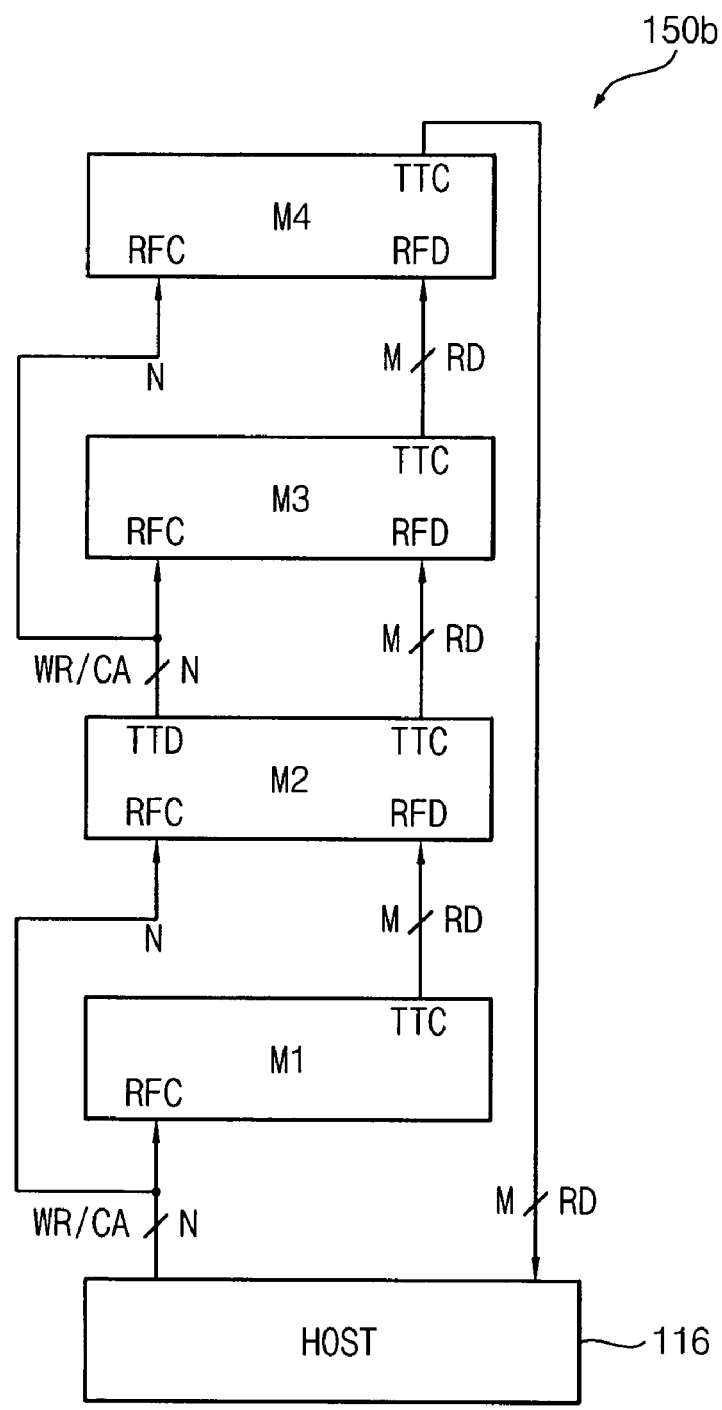

FIGS. 6A and 6B contain schematic block diagrams of a memory system 150a, 150b, in accordance with embodiments of the invention. The embodiments of FIGS. 6A and 6B illustrate the sharing of package pins in a deeper link structure to significantly increase the memory size for memory intensive applications. In the system 150a of FIG. 6A, all ports of M2 and M3 are used to make the link structure. Therefore, they cannot share pins. In the memory system 150b of FIG. 6B, all ports of M2 are used to make the link structure. Therefore, package pins cannot be shared.

Figure 7A:
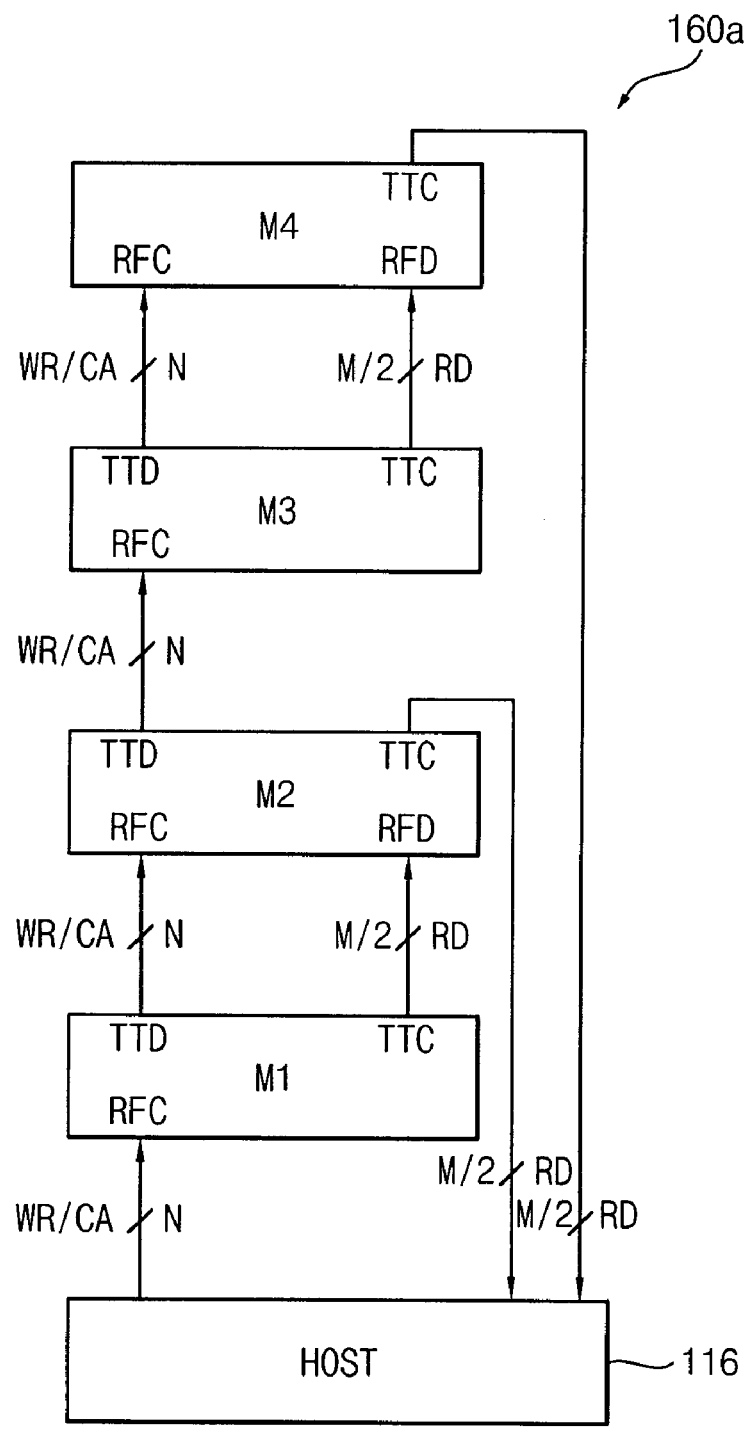
FIGS. 7A and 7B contain schematic block diagrams of a memory system, illustrating an approach to sharing pins according to the invention for the deeper link structures of FIGS. 6A and 6B, respectively.
Figure 7B:
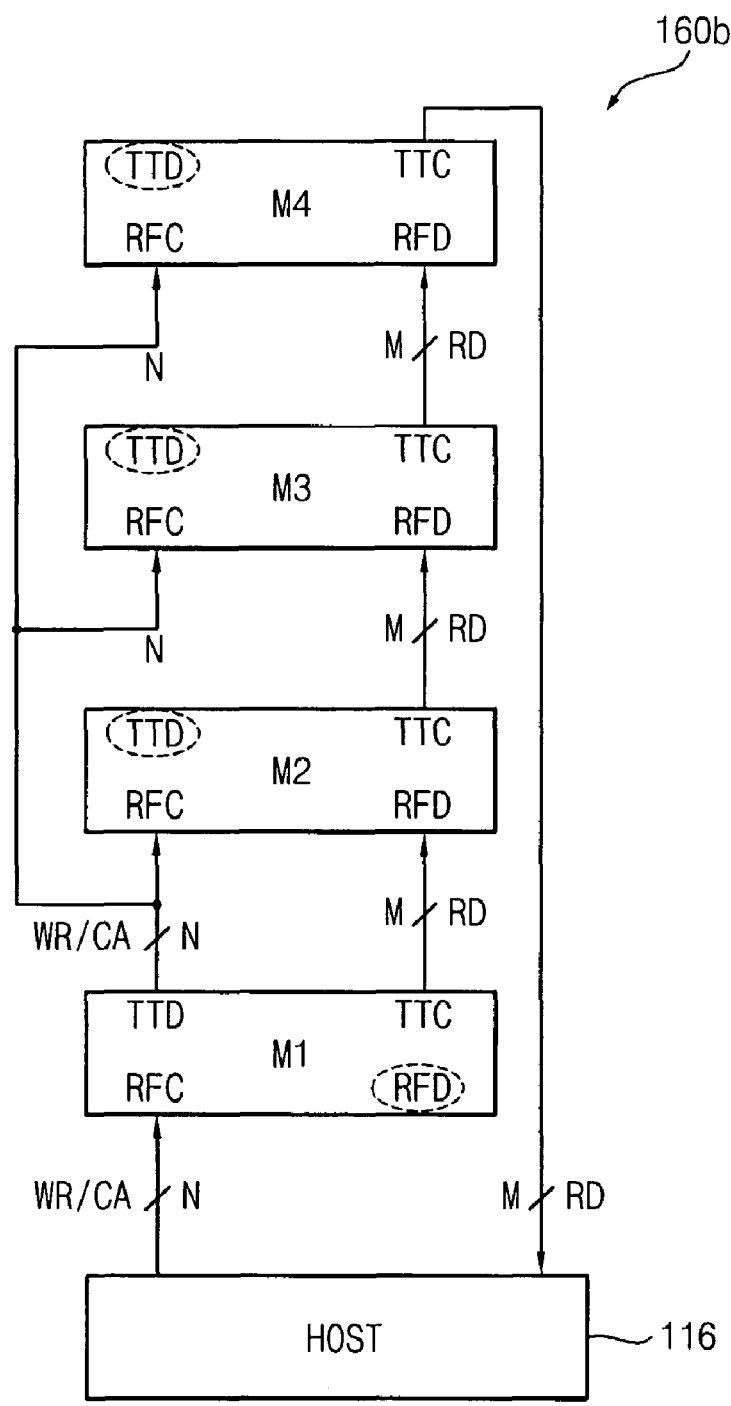

FIGS. 7A and 7B contain schematic block diagrams of a memory system 160a and 160b, illustrating an approach to sharing pins according to the invention for the deeper link structures of FIGS. 6A and 6B, respectively. In the system 160a of FIG. 7A, all ports of M2 are used to make the link structure, so that package pins cannot be shared. In the memory system 160b of FIG. 7, every memory M1, M2, M3 and M4 has one unused port. Therefore, package pins can be shared. One issue with the system of FIG. 7B is that it may experience longer delay or latency.

Figure 8A:
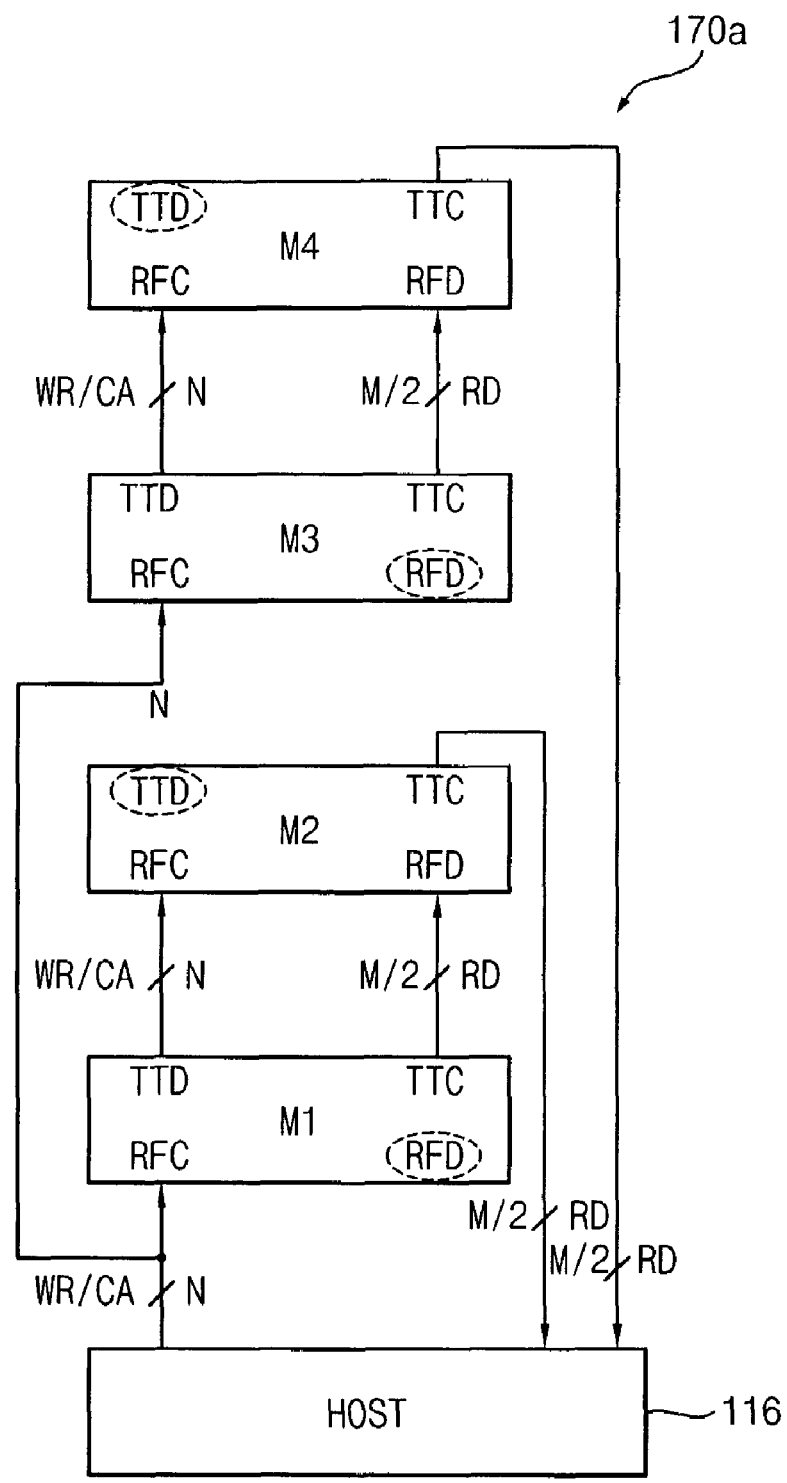
FIGS. 8A and 8B contain schematic block diagrams of a memory system, illustrating another approach to sharing pins according to the invention for the deeper link structures of FIGS. 6A and 6B, respectively.
Figure 8B:
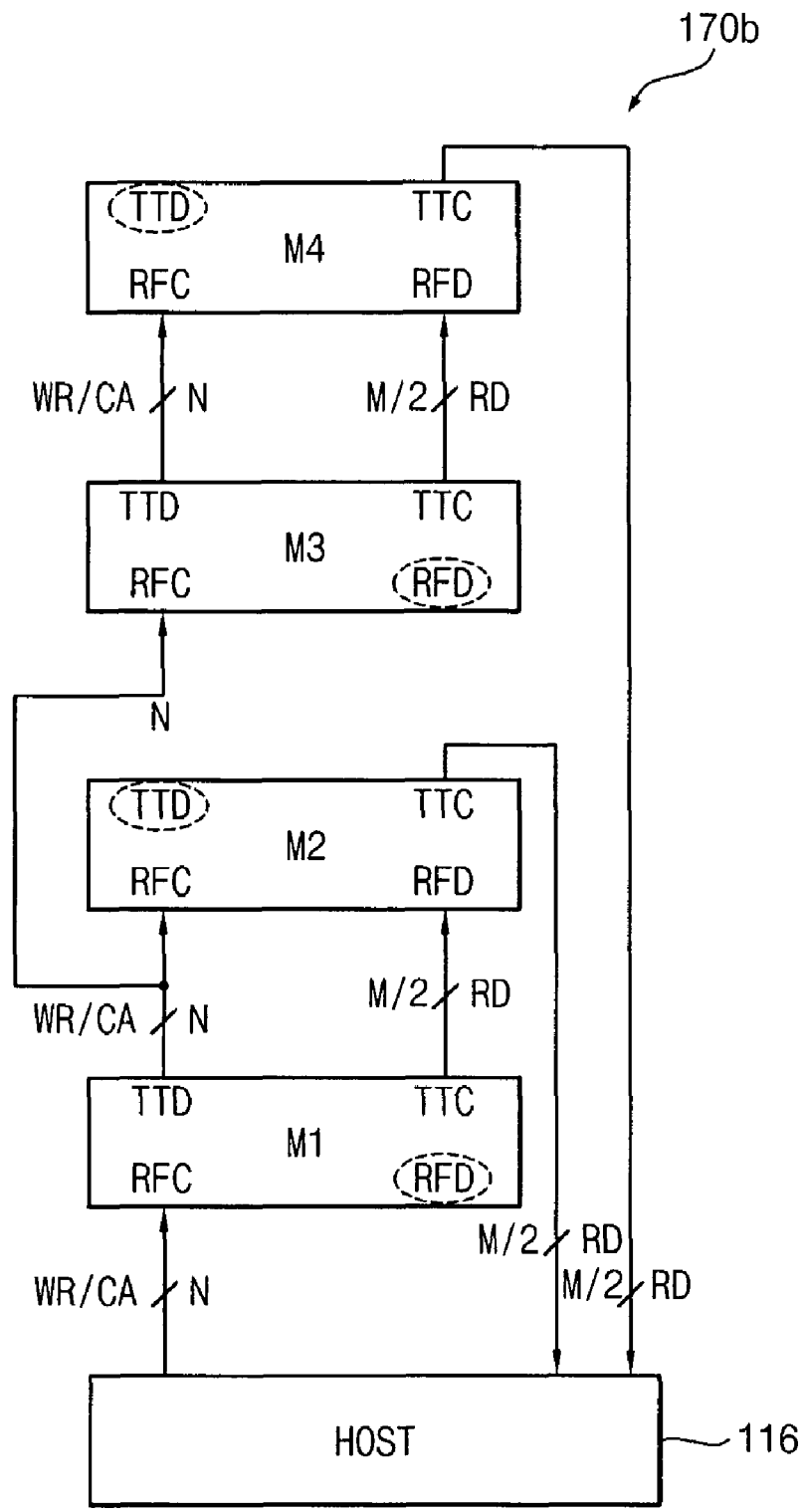

FIGS. 8A and 8B contain schematic block diagrams of a memory system 170a and 170b, illustrating another approach to sharing pins according to the invention for the deeper link structures of FIGS. 6A and 6B, respectively. In these embodiments, each memory has an unused port, namely, either the RFD or TTD port. Therefore, the RFD port and the TTD port can share package pins. This configuration of FIGS. 8A and 8B has a relatively lower level of access delay or latency compared to the configuration of FIGS. 7A and 7B.

Figure 9:
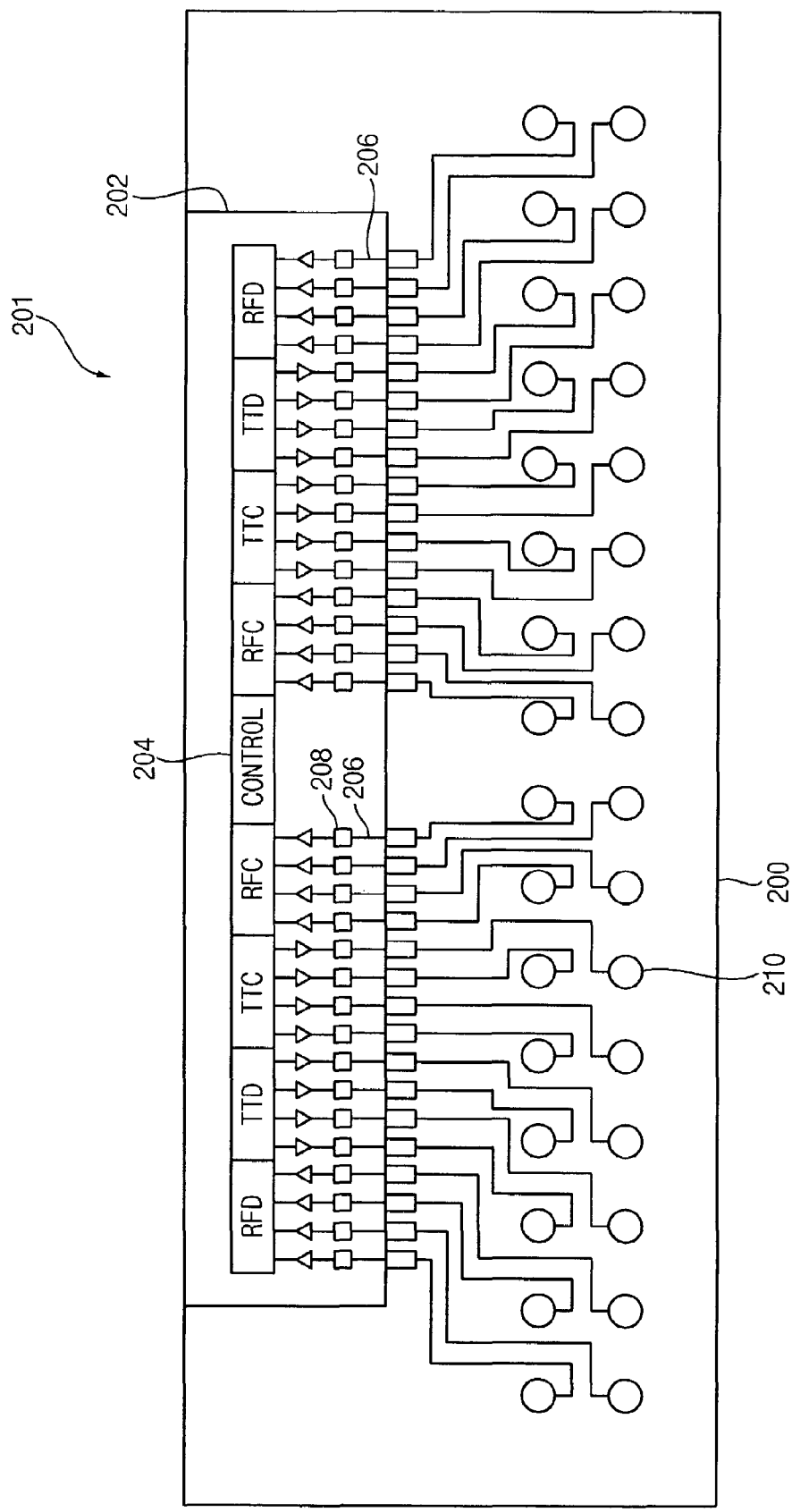
FIG. 9 is a schematic plan view of a memory device having a ball grid array package in accordance with the invention.

FIG. 9 is a schematic plan view of a memory device 201 having a ball grid array package 200 in accordance with the invention. It is noted that FIG. 9 illustrates only a portion of the memory device 201 for clarity and ease of illustration and description. It is also noted that the following description of embodiments of the invention uses the BGA package as an illustrative example only. The invention is applicable to other types of packages, such as a plastic package with leads or pins.

The memory device 201 includes a DRAM die 202 which includes all of the circuitry of a DRAM. The circuitry includes the circuit blocks for the four ports of each memory, namely, the RFD, TTD, TTC and RFC ports. Two sets of ports are illustrated for the two illustrated memories integrated on the DRAM die 202. The circuitry on the DRAM die also includes the control circuitry 204. Each of the ports is shown as having four conductor outputs connected to four die pads 208, respectively. A wire bond pattern 206 connects the die pads to respective package balls 210. Thus, in this configuration, each memory port is connected to and occupies a group of four package balls 210. In this configuration, there is no sharing of pins or balls, since all of the ports of all of the memories are connected to balls. The size of the package 200 is determined by the number of balls 210. As the number of balls increases, the pitch of the balls needs to decrease to accommodate the number of balls and to reduce the interconnection lengths. This can cause difficulty in the routing of signal lines.

Figure 10:
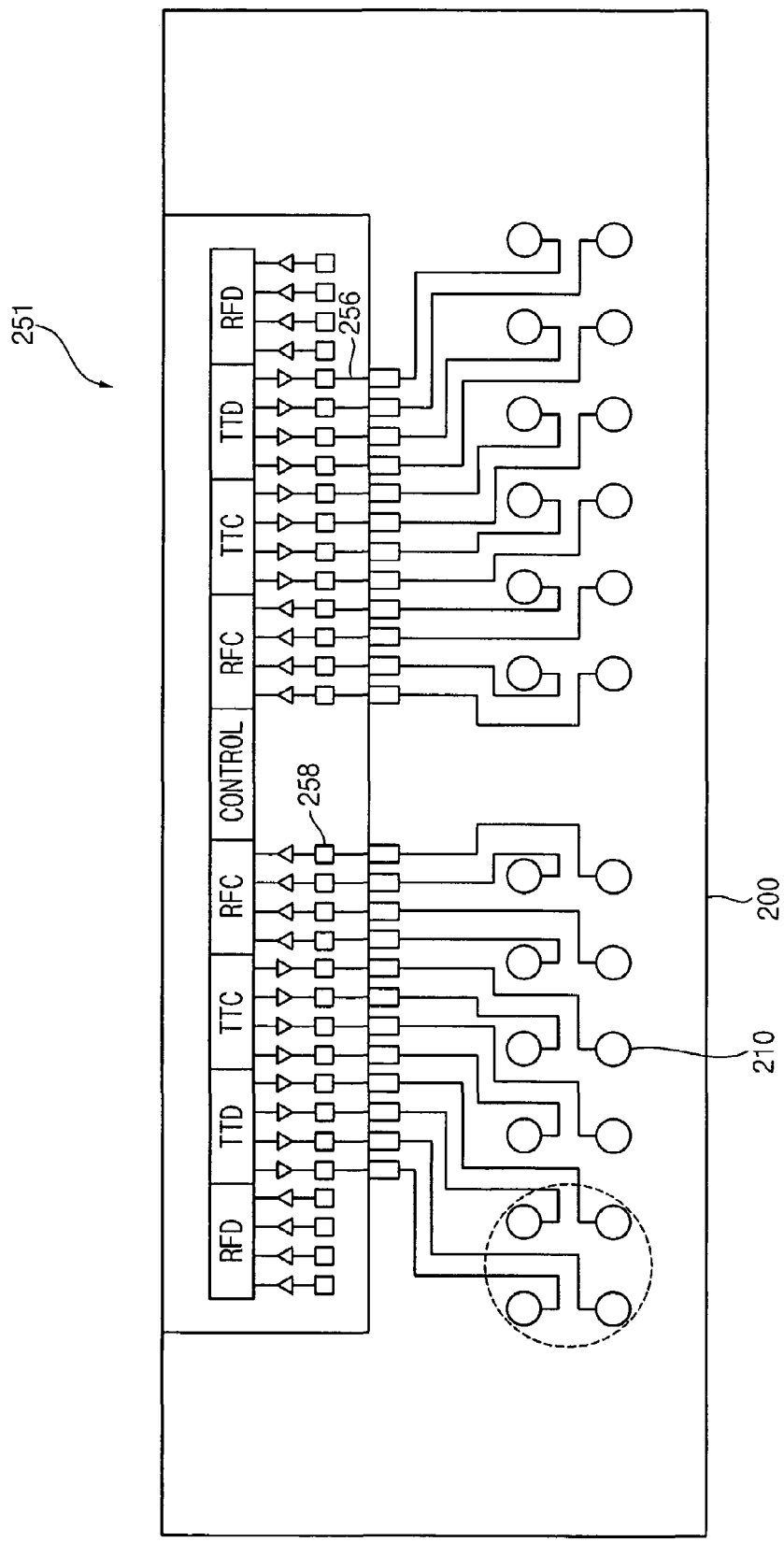
FIG. 10 is a schematic plan view of a memory device having a ball grid array package in accordance with an embodiment of the invention.

FIG. 10 is a schematic plan view of a memory device 251 having a ball grid array package 200 in accordance with an embodiment of the invention. This embodiment corresponds with the memory M1 in memory system 100b in FIG. 5B. In this embodiment, the RFD port is not is not used. Therefore, there is no connection from the die pads 258 of the RFD ports to the balls 210 via the wire bonds 256. Hence, in this embodiment, the four balls 210 in the dashed circle are considered reconfigurable based on the application in which the memory device 251 is to be used. In this particular case, the memory circuit 251 is used in an application in which the RFD port is not used, so, the four pins in the dashed circle are "shared" by the RFD port and the TTD port. That is, the memory circuit 251 is reconfigurable such that the four pins in the dashed circle can be used by the TTD port instead of the RFD port. As a result, the total number of balls required for each memory circuit is reduced from 16 to 12.

Figure 11:
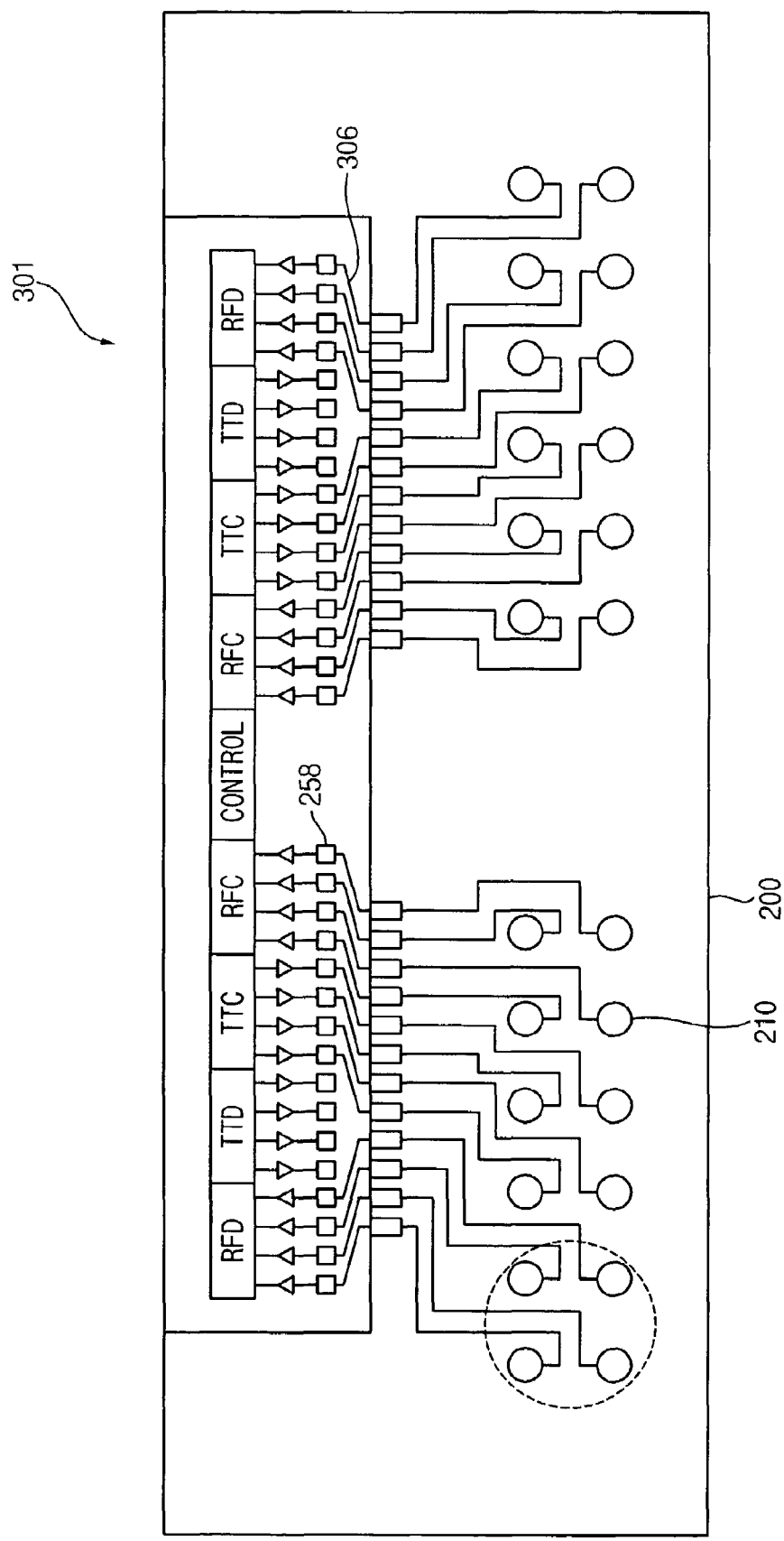
FIG. 11 is a schematic plan view of a memory device having a ball grid array package in accordance with an embodiment of the invention.

FIG. 11 is a schematic plan view of a memory device 301 having a ball grid array package 200 in accordance with an embodiment of the invention. This embodiment corresponds with the memory M2 in memory system 100b in FIG. 5B. In this embodiment, the TTD port is not is not used. Therefore, there is no connection from the die pads 258 of the TTD ports to the balls 210 via the wire bonds 306. Hence, in this embodiment, the four balls 210 in the dashed circle are considered reconfigurable based on the application in which the memory device 301 is to be used. In this particular case, the memory circuit 301 is used in an application in which the TTD port is not used, so, the four pins in the dashed circle are "shared" by the RFD port and the TTD port. That is, the memory circuit 301 is reconfigurable such that the four pins in the dashed circle can be used by the RFD port instead of the TTD port. As a result, the total number of balls required for each memory circuit is reduced from 16 to 12.

Figure 12:
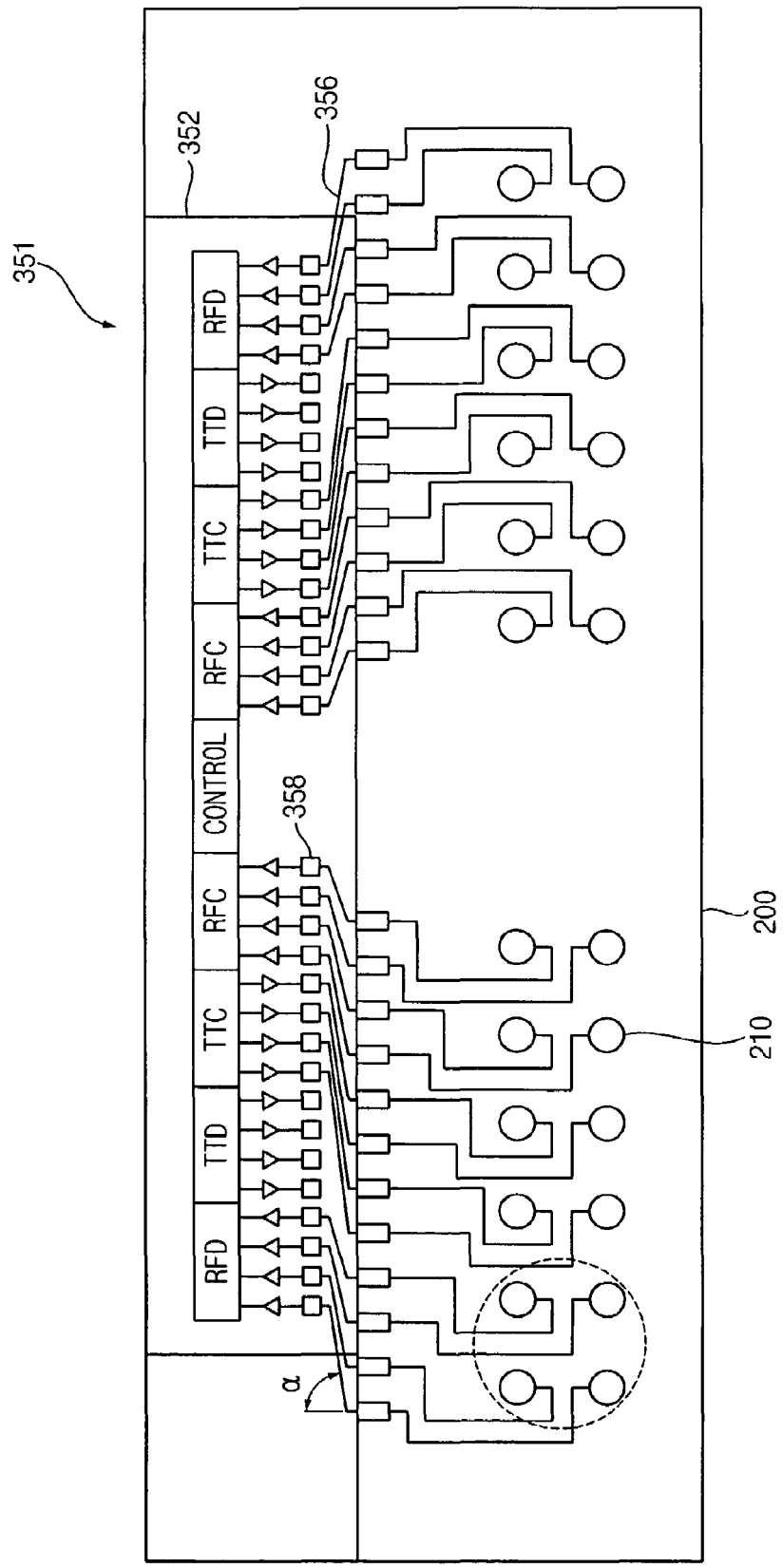
FIG. 12 is a schematic plan view of a memory device having a ball grid array package in accordance with an embodiment of the invention, in which the size of the chip die is reduced.

FIG. 12 is a schematic plan view of a memory device 351 having a ball grid array package 200 in accordance with an embodiment of the invention, in which the size of the chip die 352 is reduced. This embodiment is the same as that of FIG. 11, except for the reduction in the chip die size. As shown in FIG. 12, because of the reduced chip size, the angle α of the package bump to the die pad 358 defined by the wire bond 356 increases as the chip die size is reduced. This angle is a limiter in reducing the chip die size and give rise to the preference that the number of package balls be reduced in order to reduce the package footprint size.

FIG. 13 is a schematic plan view of a memory device 401 having a ball grid array package 400 in accordance with an alternative embodiment of the invention. This embodiment corresponds with the memory M1 in memory system 100b in FIG. 5B. In this embodiment, the TTD port and the RFD port share a set of four die pads 409, which are connected to the balls 210 by the wire bonds 411. This sharing is accomplished by a pair of directional buffer circuits 405 and 407. A control signal generated by the control circuit 403 controls whether the TTD or RFD port is using the shared die pads 409, as well as the direction of signal flow. When the RFD port is active to receive signals from the outside, the control signal activates the buffer circuit 405 to allow the signal flow through the RFD port. At the same time, the control signal deactivates the buffer circuit 407 to prevent signal flow through the TTD port to the outside. When the TTD port is active to transmit signals to the outside, the control signal activates the buffer circuit 407 to allow the signal flow through the TTD port. At the same time, the control signal deactivates the buffer circuit 405 to prevent signal flow through the RFD port from the outside. Hence, in this embodiment, the four balls 210 in the dashed circle are considered reconfigurable based on the application in which the memory device 401 is to be used. In this particular case, the memory circuit 401 is used in an application in which one of the TTD port and RFD port is used and the other is not used, so, the four balls 210 in the dashed circle are "shared" by the RFD port and the TTD port. That is, the memory circuit 401 is reconfigurable such that the four balls 210 in the dashed circle can be used by either of the RFD port and the TTD port. As a result, the total number of balls required for each memory circuit is reduced from 16 to 12.

Figure 14A:
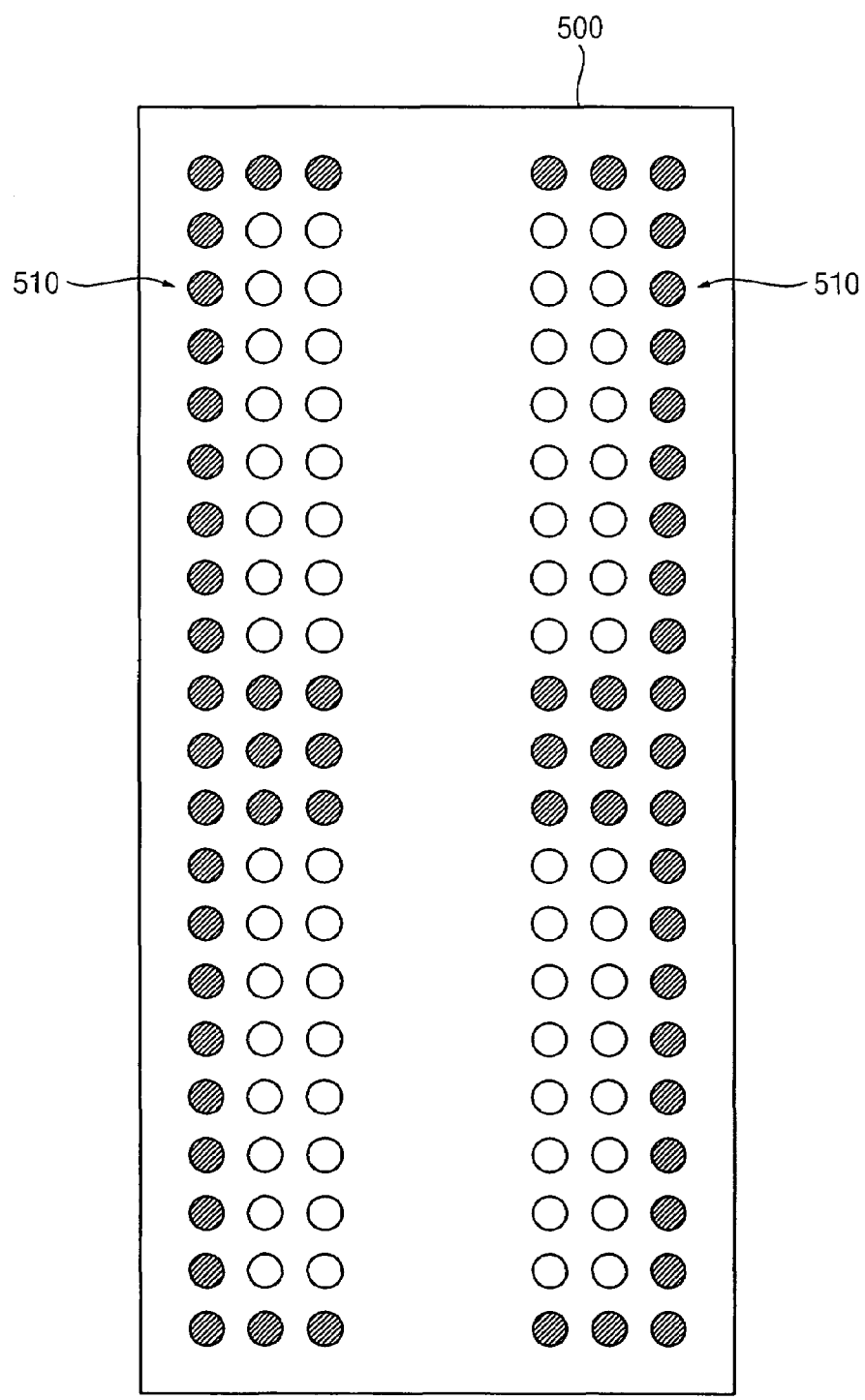
FIG. 14A contains a schematic view of a memory circuit package without the reconfigurable shared pins according to the invention.
Figure 14B:
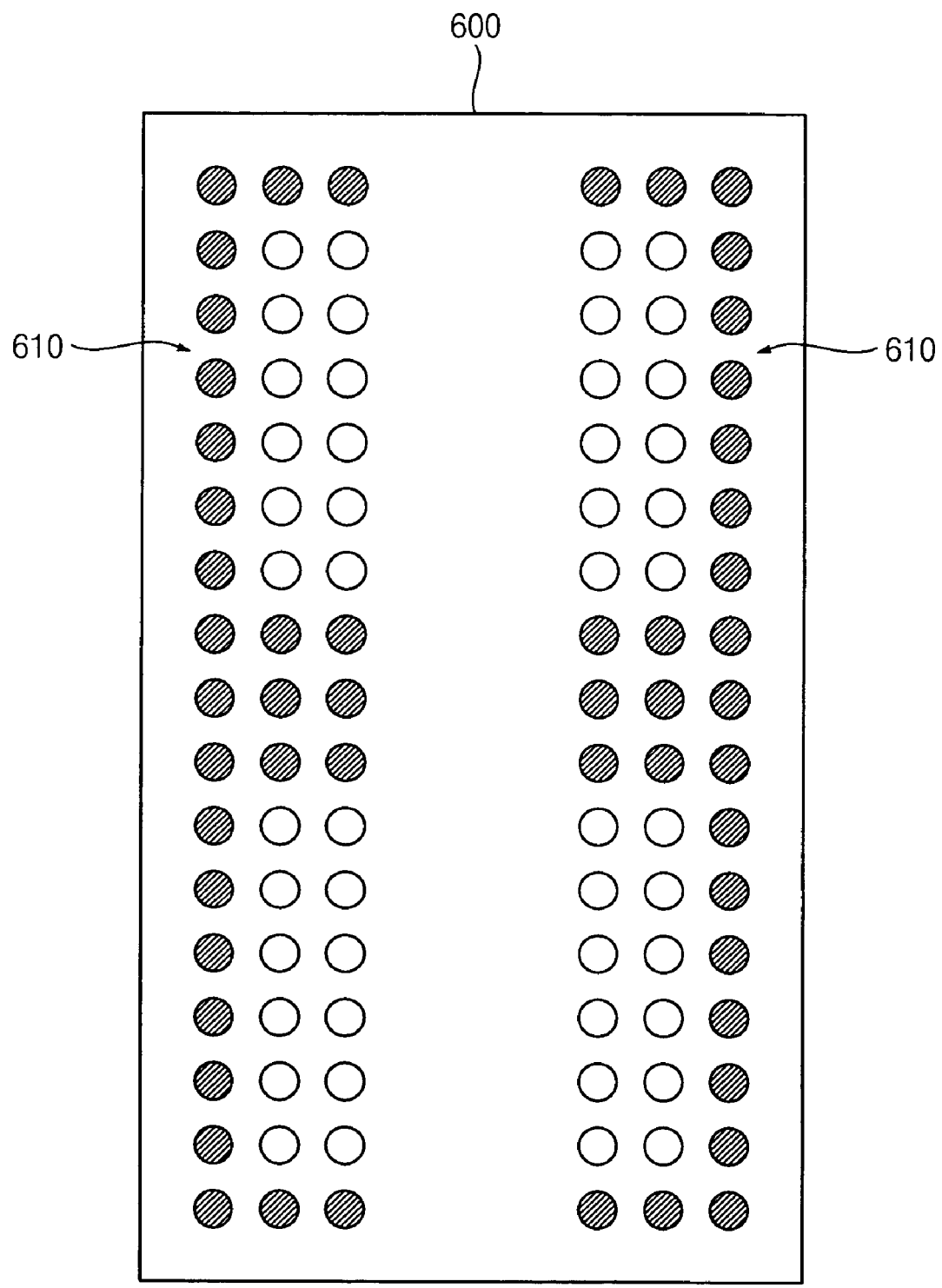
FIG. 14B contains a schematic view of a memory circuit package with the reconfigurable shared pins according to the invention.

FIGS. 14A contains a schematic view of a memory circuit package 500 without the reconfigurable shared pins according to the invention. FIG. 14B contains a schematic view of a memory circuit package 600 with the reconfigurable shared pins according to the invention. In FIGS. 14A and 14B, the circuits 500 and 600 include a plurality of package pins or balls 510 and 610, respectively. The filled dark pins 510 and 610 are used for power, control, clock and other functions than the memory C/A and data signals. The open pins are used for the memory C/A and data signals. It is noted that with application of the shared pins of the invention, the circuit 600 has four fewer rows of pins 610 than the circuit 500. As a result, the size of the package in FIG. 14B is substantially reduced over that in FIG. 14A.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A memory system, comprising:
   a primary memory; and
   a secondary memory coupled to the primary memory; and
   a set of external conductor elements for connecting to at least one of the primary memory and the secondary memory; wherein:
   each of the primary memory and the secondary memory comprises a receiving port and a transmitting port, the transmitting port having a first predetermined number of contacts for transferring signals and the receiving port having a second predetermined number of contacts for transferring signals, the memory system further comprising:
   a wiring subsystem comprising a set of conductors configured to connect only one of the receiving port contacts and the transmitting port contacts to a subset of the external conductor elements such that only one of the transmitting port and the receiving port is connected to the subset of the external conductor elements, the one of the transmitting port and receiving port connected to the external conductor elements being used and the other of the transmitting port and receiving port being unused, wherein:
   the sum of the first predetermined number of contacts and the second predetermined number of contacts is greater than a number of external conductor elements in the subset of the external conductor elements; and
   the memory system is configurable to have one of a first configuration and a second configuration, wherein, in the first configuration, the set of conductors of the wiring subsystem connects the transmitting port contacts to the subset of external conductor elements, and the receiving port contacts are unused such that the receiving port contacts are not connected to any of the external conductor elements, and wherein, in the second configuration, the set of conductors of the wiring subsystem connects the receiving port contacts to the subset of external conductor elements, and the transmitting port contacts are unused and are not connected to any of the external conductor elements.

2. The memory system of claim 1, wherein the external conductor elements are balls of a ball grid array device package.

3. The memory system of claim 1, wherein the external conductor elements are pins.

4. The memory system of claim 1, wherein the memory device is a DRAM memory device.

5. A memory device, comprising:
a receiving port for receiving signals and a transmitting port for transmitting signals, the transmitting port having a first predetermined number of contacts for transferring signals and the receiving port having a second predetermined number of contacts for transferring signals;
a set of external conductor elements for connecting to the memory device; and
a wiring subsystem comprising a set of conductors configured to connect only one of the receiving port contacts and transmitting port contacts to a subset of the external conductor elements such that only one of the transmitting port and the receiving port is connected to the subset of the external conductor elements, the one of the transmitting port and receiving port connected to the external conductor elements being used and the other of the transmitting port and receiving port being unused, wherein:
the sum of the first predetermined number of contacts and the second predetermined number of contacts is greater than a number of external conductor elements in the subset of the external conductor elements; and
the memory system is configurable to have one of a first configuration and a second configuration, wherein, in the first configuration, the set of conductors of the wiring subsystem connects the transmitting port contacts to the subset of external conductor elements, and the receiving port contacts are unused such that the receiving port contacts are not connected to any of the external conductor elements, and wherein, in the second configuration, the set of conductors of the wiring subsystem connects the receiving port contacts to the subset of external conductor elements, and the transmitting port contacts are unused and are not connected to any of the external conductor elements.

6. The memory device of claim 5, wherein the external conductor elements are balls of a ball grid array device package.

7. The memory system of claim 5, wherein the external conductor elements are pins.

8. The memory system of claim 5, wherein the memory device is a DRAM memory device.

9. A memory system, comprising:
a primary memory; and
a secondary memory coupled to the primary memory; and
a set of external conductor elements for connecting to the at least one of the primary memory and the secondary memory; wherein:
each of the primary memory and the secondary memory comprises a receiving port and a transmitting port; and
a wiring subsystem comprising a set of conductors configured to connect only one of the receiving port and transmitting port of at least one of the primary and secondary memory to the set of external conductor elements, wherein:
each of the primary memory and the secondary memory has a first predetermined number of input/output connections for accommodating the transmitting and receiving ports, and the set of external conductor elements has a second predetermined number of external conductor elements, the second predetermined number being less than the first predetermined number; and
the memory system is configurable to have one of a first configuration and a second configuration, wherein, in the first configuration, the set of conductors of the wiring subsystem connects transmitting port input/output connections of the first predetermined number of input/output connections for accommodating the transmitting port to the set of external conductor elements, and receiving port input/output connections of the first predetermined number of input/output connections for accommodating the receiving port input/output connections are unused such that the receiving port input/output connections are not connected to any of the external conductor elements, and wherein, in the second configuration, the set of conductors of the wiring subsystem connects the receiving port input/output connections to the set of external conductor elements, and the transmitting port input/output connections are unused and are not connected to any of the external conductor elements.

10. The memory system of claim 9, wherein the external conductor elements are balls of a ball grid array device package.

11. The memory system of claim 9, wherein the external conductor elements are pins.

12. The memory system of claim 9, wherein the memory device is a DRAM memory device.

13. A memory device, comprising:
a receiving port for receiving signals and a transmitting port for transmitting signals;
a set of external conductor elements for connecting to the memory device; and
a wiring subsystem comprising a set of conductors configured to connect only one of the receiving port and transmitting port to the set of external conductor elements, wherein:
the receiving port and the transmitting port are associated with a first predetermined number of input/output connections for accommodating the transmitting and receiving ports, and the set of external conductor elements has a second predetermined number of external conductor elements, the second predetermined number being less than the first predetermined number; and
the memory system is configurable to have one of a first configuration and a second configuration, wherein, in the first configuration, the set of conductors of the wiring subsystem connects transmitting port input/output connections of the first predetermined number of input/output connections for accommodating the transmitting port to the set of external conductor elements, and receiving port input/output connections of the first predetermined number of input/output connections for accommodating the receiving port input/output connections are unused such that the receiving port input/output connections are not connected to any of the external conductor elements, and wherein, in the second configuration, the set of conductors of the wiring subsystem connects the receiving port input/output connections to the set of external conductor elements, and the transmitting port input/output connections are unused and are not connected to any of the external conductor elements.

14. The memory device of claim 13, wherein the external conductor elements are balls of a ball grid array device package.

15. The memory system of claim 13, wherein the external conductor elements are pins.

16. The memory system of claim 13, wherein the memory device is a DRAM memory device.

* * * * *